United States Patent
Wang et al.

(10) Patent No.: US 7,952,956 B2
(45) Date of Patent: May 31, 2011

(54) VARIABLE RESISTANCE MEMORY DEVICE AND SYSTEM

(75) Inventors: Qi Wang, Suwon-si (KR); Kwang-Jin Lee, Hwaseong-si (KR); Woo-Yeong Cho, Suwon-si (KR); Taek-Sung Kim, Yongin-si (KR); Kwang-Ho Kim, Hwaseong-si (KR); Hyun-Ho Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 203 days.

(21) Appl. No.: 12/417,679

(22) Filed: Apr. 3, 2009

(65) Prior Publication Data

US 2009/0251954 A1  Oct. 8, 2009

(51) Int. Cl.
*G11C 8/00* (2006.01)
(52) U.S. Cl. .......... 365/230.09; 365/145; 365/148; 365/158; 365/163; 365/189.2
(58) Field of Classification Search .......... 365/185.12, 365/185.17, 185.33, 46, 145, 148, 158, 163, 365/189.2, 230.09, 238.5
See application file for complete search history.

(56) References Cited

U.S. PATENT DOCUMENTS

| | | | | |
|---|---|---|---|---|
| 7,023,726 B1 * | 4/2006 | Chen et al. | ..................... | 365/158 |
| 7,394,717 B2 * | 7/2008 | Hidaka | ..................... | 365/230.03 |
| 7,406,572 B1 * | 7/2008 | Nguyen | ..................... | 711/154 |
| 7,719,882 B2 * | 5/2010 | Lin et al. | ..................... | 365/158 |
| 7,738,304 B2 * | 6/2010 | Maayan et al. | ..................... | 365/185.33 |
| 7,773,420 B2 * | 8/2010 | Kim | ..................... | 365/185.08 |
| 2005/0157563 A1 * | 7/2005 | Lin et al. | ..................... | 365/189.01 |

FOREIGN PATENT DOCUMENTS

| | | |
|---|---|---|
| JP | 2005190201 A | 7/2005 |
| KR | 1019990029329 A | 4/1999 |
| KR | 1020000067748 A | 11/2000 |
| KR | 1020030009118 A | 1/2003 |
| KR | 1020030021631 A | 3/2003 |
| KR | 1020050107369 A | 11/2005 |
| KR | 100610647 B1 | 8/2006 |

* cited by examiner

*Primary Examiner* — VanThu Nguyen
(74) *Attorney, Agent, or Firm* — Volentine & Whitt, PLLC

(57) ABSTRACT

A semiconductor memory device includes a memory cell array having a plurality of variable resistance memory cells divided into first and second areas. An I/O circuit is configured to access the memory cell array under the control of control logic so as to access the first or second area in response to an external command. The I/O circuit accesses the first area using a memory cell unit and the second area using a page unit.

24 Claims, 13 Drawing Sheets

US 7,952,956 B2

VARIABLE RESISTANCE MEMORY DEVICE AND SYSTEM

PRIORITY STATEMENT

This application claims priority under 35 U.S.C §119 to Korean Patent Application No. 2008-0032768 filed on Apr. 8, 2008, the subject matter of which is hereby incorporated by reference.

BACKGROUND

The present invention relates to a semiconductor memory device and memory system. More particularly, the present invention relates to a variable resistance memory device and memory system incorporating same.

Demand is increasing for a semiconductor memory device capable of randomly accessing non-volatile stored data and being highly integrated to yield large data storage capacity. A typical example of such a semiconductor memory device is flash memory commonly used in portable electronic devices, for example. As an alternative to flash memory, certain variable resistance memory devices providing non-volatile data storage have been proposed as replacements for volatile memory devices such as the conventional DRAM.

Exemplary variable resistance memory devices include the Ferroelectric RAM (FRAM) utilizing a ferroelectric capacitor, Magnetic RAM (MRAM) using tunneling magneto-resistive (TMR) layer, and phase change memory device using chalcogenide alloys. Of these, the phase change memory device enjoys relative advantages in its relatively simple fabrication process, large data storage capacity, and relatively low cost of fabrication.

FIGS. 1 and 2 schematically illustrate memory cells for variable resistance memory devices. Referring to FIG. 1, a memory cell 10 includes a memory element 11 and a select element 12. The memory element 11 is connected between a bit line BL and the select element 12, and the select element 12 is connected between the memory element 11 and a ground.

The memory element 11 includes a variable resistance material (e.g., an alloy of Ge—Sb—Te or "GST"). Such variable resistance materials exhibiting a resistance that varies in relation to an applied temperature. The variable resistance material is characterized by two stable states (a crystalline state and an amorphous state), each induced by a particular temperature application. The state of the variable resistance material may be varied according to a current supplied via the bit line BL. The variable resistance memory device programs data using the state-disparate resistance characteristics of the variable resistance material.

The select element 12 includes an NMOS transistor NT. A word line WL is connected to a gate of the NMOS transistor NT. When a predetermined voltage is supplied to the word line WL, the NMOS transistor NT is turned ON. When the NMOS transistor NT is turned ON, a current is supplied to the memory element 11 via the bit line BL. Referring to FIG. 1, the memory device 11 is connected between the bit line BL and the select element 12. However, the select element 12 may be connected between the bit line BL and the memory element 11.

Referring to FIG. 2, a memory cell 20 includes a memory element 21 and a select element 22. The memory element 21 is connected between the bit line BL and the select element 22, and the select element 22 is connected between the memory element 21 and ground. The memory element 21 is configured identically with the memory element 11 of FIG. 1.

The select element 22 is a diode D. The memory element 21 is connected to an anode of the diode D, and a word line WL is connected to a cathode thereof. When a voltage difference between the anode and cathode of the diode D becomes higher than a threshold voltage, the diode D is turned ON. When the diode D is turned ON, a current is supplied to the memory element 21 via the bit line BL.

FIG. 3 is a graph generally illustrating the respective temperature/time characteristics (or temperature conditions) for programming (i.e., changing the state) of the variable resistance material of FIGS. 1 and 2. In FIG. 3, a reference numeral 1 indicates a first temperature condition placing the variable resistance material into the amorphous state. Reference numeral 2 indicates a second temperature condition placing the variable resistance material into the crystalline state.

In the first temperature condition, the variable resistance material is heated by a temperature higher than its melting temperature (Tm) for a first time period (T1), then quickly quenched into the amorphous state. Conventionally, the amorphous state is assigned a reset data state, or a data value of '1'. The variable resistance memory device provides a so-called "reset current" to the variable resistance material in order to program it to the reset state.

In the second temperature condition, the variable resistance material is heated by a temperature higher than its crystallization temperature (Tc) but lower than the melting temperature (Tm) for a second time period (T2) longer than T1. Then the variable resistance material is cooled relatively slowly into the crystalline state. The crystalline state is conventionally assigned a set state, or a data value of '0'. The variable resistance memory device provides a so-called "set current" to the variable resistance material in order to program it to the set state.

Moving from the foregoing discussion of variable resistance memory devices, a NOR flash memory may generally be used to store frequently updated data, such as meta data. NOR flash memory thus supports random data using a relatively small unit (e.g., 16 bits) to enable rapid data access. Moreover, NOR flash memory is capable of accessing data without address mapping by means of a flash translation layer (FTL).

On the other hand, NAND flash memory may be used to effectively store large quantities of less frequently updated data, such as so-called user data. In order to access data stored in NAND flash memory, a FTL is required to map addresses. The FTL converts a physical address to a logical address, or vice versa. NAND flash memory performs access operations in page units and does not support random data access. Therefore, NAND flash memory is not suitable for use in accessing data in small unit sizes, but is advantageous in accessing large blocks of data. Due to such characteristics, NOR flash memory and NAND flash memory are used for different purposes, and NOR flash memory and NAND flash memory are typically both required to effectively store code data (or meta data) and user data.

FIG. 4 is a block diagram of a general computer system including both NOR flash memory and NAND flash memory. Referring to FIG. 4, a NOR flash memory 110 is connected to a system bus 150 via a NOR controller 120. A NAND flash memory 130 is connected to the system bus 150 via a NAND controller. As such, both the NOR controller 120 and the NAND controller 140 are required in a system having both the NOR flash memory 110 and NAND flash memory 120. This requirement increases the overall manufacturing cost for the semiconductor memory device, and adversely affects integration density of the device.

SUMMARY

In one embodiment, the present invention provides a semiconductor memory device comprising; a memory cell array including a plurality of variable resistance memory cells divided into a first area and a second area, an input/output circuit configured to access the memory cell array, and control logic configured to control the input/output circuit to access the first area or the second area in response to an external command, wherein the input/output circuit accesses the first area in a memory cell unit, and accesses the second area in a page unit.

In another embodiment, the invention provides a memory system comprising; a semiconductor memory device including a variable resistance memory cell array divided into a first area and a second area, and a memory controller configured to access the first area or the second area in response to an external command, wherein the semiconductor memory device accesses the first area in a memory cell unit, and accesses the second area in a page unit.

In another embodiment, the invention provides a memory system comprising; a semiconductor memory device, and a memory controller configured to supply control signals and a select signal to the semiconductor memory device in response to an external command, wherein the semiconductor memory device includes; a variable resistance memory cell array divided into a first area and a second area, an input/output circuit configured to access the variable resistance memory cell array, a memory interface configured to convert the control signals into first area access signals or second area access signals in response to the select signal, and a control logic for controlling the input/output circuit in response to the first area access signals or the second area access signals.

In another embodiment, the invention provides a memory system comprising; an application layer executed at least in part by a Central Processing Unit (CPU), a file system layer callable by the application layer and configured to generate a logic address for data to be accessed in response to a request received from the application layer, a translation layer callable by the file system layer and configured to convert the logic address into a physical address, and a control layer for a semiconductor memory device configured to access data stored in a first area in response to the logic address, and to access data stored in a second area in response to the physical address.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DESCRIPTION OF EMBODIMENTS

The present invention will now be described in some additional detail with reference to the accompanying drawings. This invention may, however, be embodied in many different forms and should not be construed as being limited to only the illustrated embodiments. Rather, these embodiments are presented as teaching examples. Throughout the written description and drawings, like reference numbers and indicators refer to like or similar elements.

Figure 5:
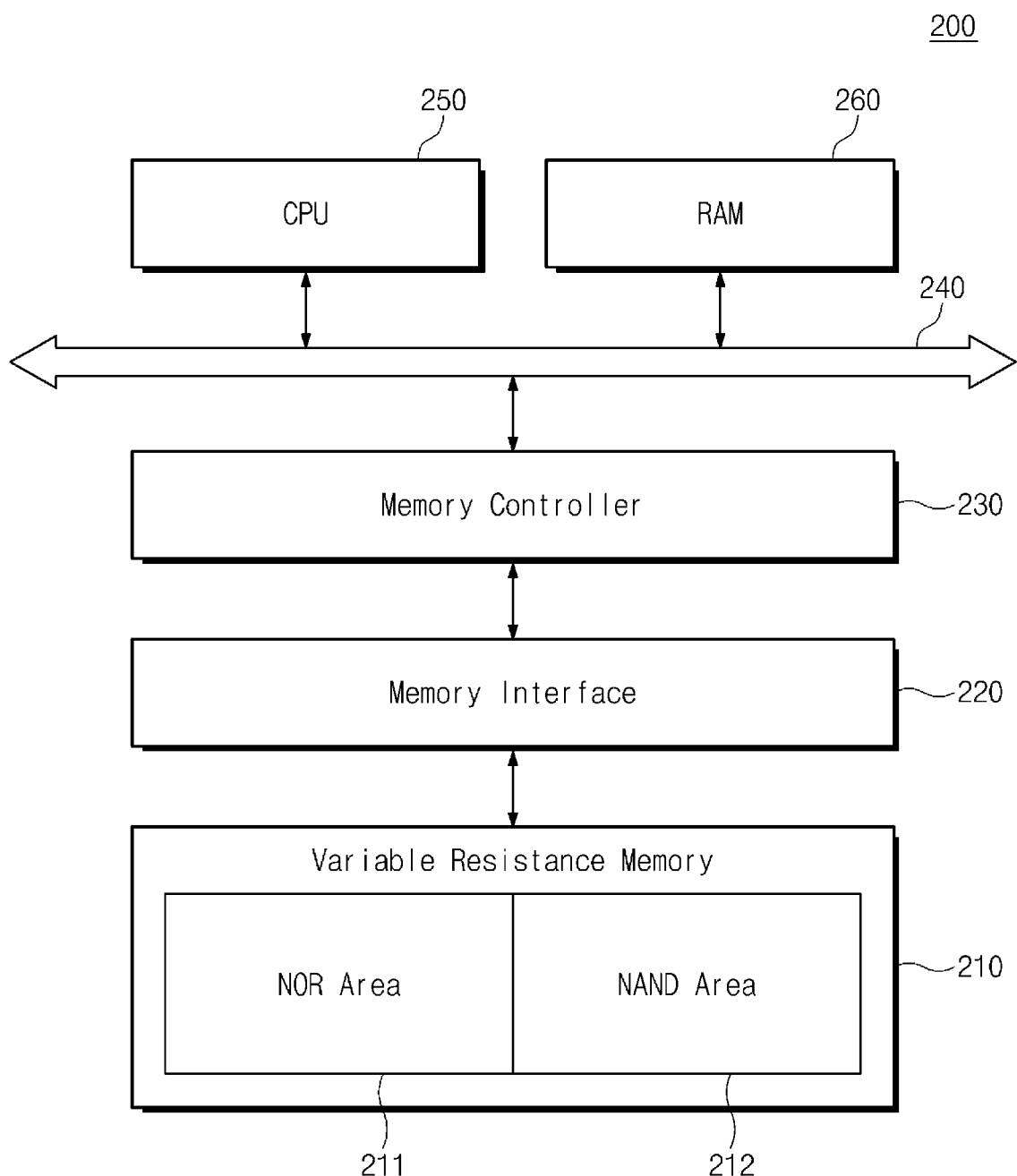
FIG. 5 is a schematic block diagram of a computer system including a memory system according to an embodiment of the invention.

FIG. 5 is a schematic block diagram illustrating a computer system including a memory system according to an embodiment of the invention. Referring to FIG. 5, a computer system 200 includes a semiconductor memory device comprising a variable resistance memory device 210, a memory interface 220, a memory controller 230, a system bus 240, a Central Processing Unit (CPU) 250, and a random access memory device 260. The random access memory device 260 may function as a main memory.

The variable resistance memory device 210, the memory interface 220, and the memory controller 230 may be realized in separate semiconductor integrated circuits or in a single semiconductor integrated circuit.

Although not shown, a conventional application chipset, a camera image processor (CIS), and/or a mobile DRAM may be further provided in relation to the illustrated computer system. Integration of these various additional components is deemed well within ordinary skill in the art.

The variable resistance memory device 210 includes a NOR area 211 and a NAND area 212. The NOR area 211 operates in a manner similar to a conventional NOR flash memory, as understood by those skilled in the art. In other words, data stored in the NOR area 211 may be accessed randomly in a defined memory cell unit. Thus, relatively small quantity data requiring rapid input and output, (e.g., code data or meta data) may be conventionally stored and accessed from the NOR area 211.

The NAND area 212 operates in a manner similar to a conventional NAND flash memory. In other words, the data stored in the NAND area 212 may be accessed in a defined page unit. The page may consist of a plurality of memory cells. Bulk data less frequently changed, (e.g., user data) may be stored in the NAND area 212.

A ratio of the NOR area 211 to the NAND area 212 in the variable resistance memory device 210 may be varied by means of mode register setting (MRS) or fuse selection and setting. For example, the mode register setting (MRS) may be conducted so that all a memory cell array of the variable resistance memory device 210 may be designated as the NOR area 211. Alternatively, the mode register setting MRS may be conducted so that a half of the memory cell array of the variable resistance memory device 210 may be designated as the NOR area 211, and the other half of the memory cell array may be designated as the NAND area 212.

The memory controller 230 controls the memory interface 220 in response to an external command transferred via the system bus 240. The memory interface 220 supplies control signals to the variable resistance memory device 210 in response to a control of the memory controller 230. For example, the memory interface 220 supplies a NOR area signal to the variable resistance memory device 210 to access code data or meta data. Or, the memory interface 220 supplies a NAND area signal to access user data.

As such, the NOR area 211 and NAND area 212 are constituted in one variable resistance memory device 210 according to the computer system 200 of the present invention. The NOR area 211 and NAND area 212 are controlled by a single memory controller 230.

Figure 6:
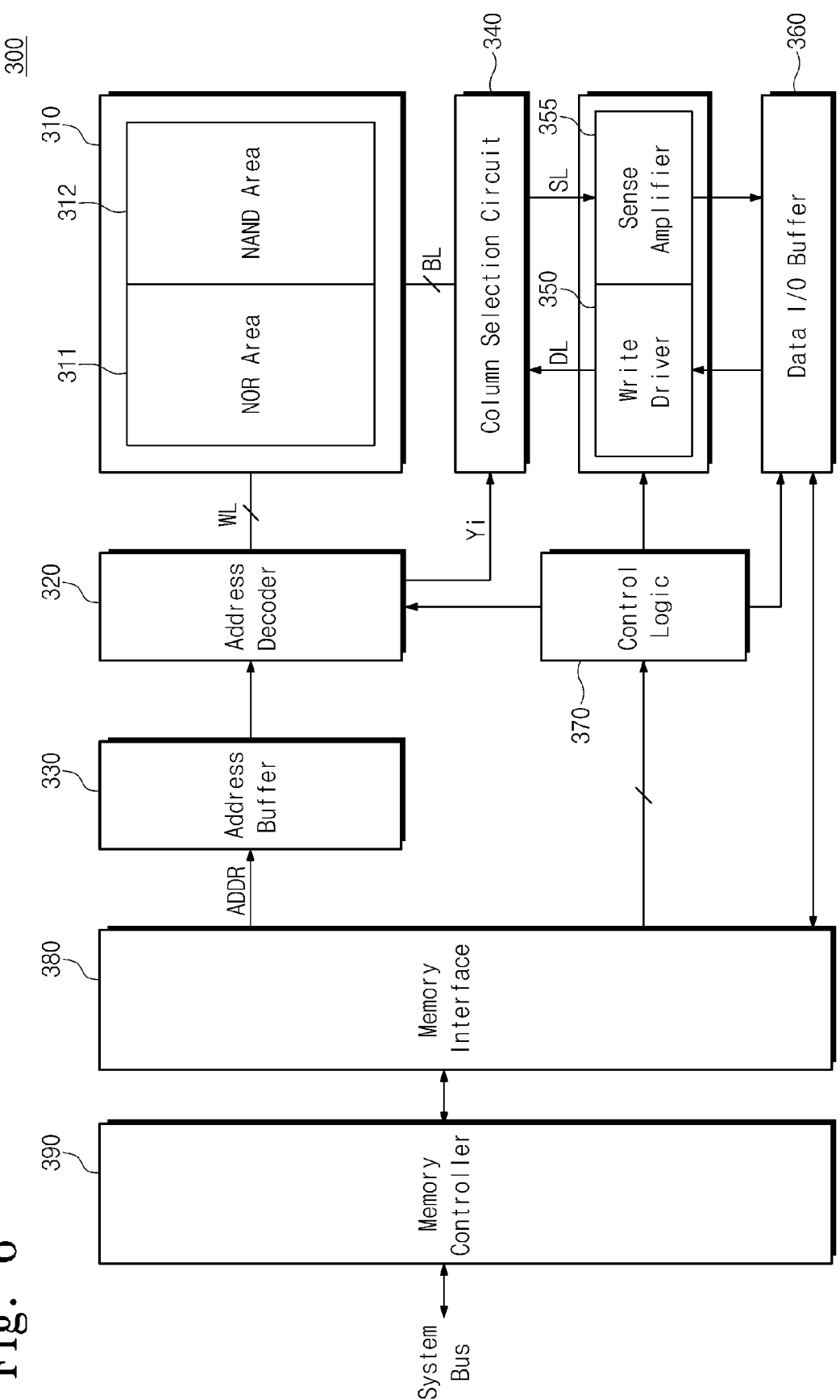
FIG. 6 is a block diagram illustrating a memory system according to an embodiment of the invention.

FIG. 6 is a block diagram illustrating an embodiment of a memory system according to the present invention. Referring to FIG. 6, the memory system 300 includes a variable resistance memory device, a memory interface 380, and a memory controller 390. The variable resistance memory device includes a memory cell array 310, an address decoder 320, an address buffer 330, a column selection circuit 340, a write driver 350, a sense amplifier 355, a data input/output buffer 360, and control logic 370.

Figure 1:
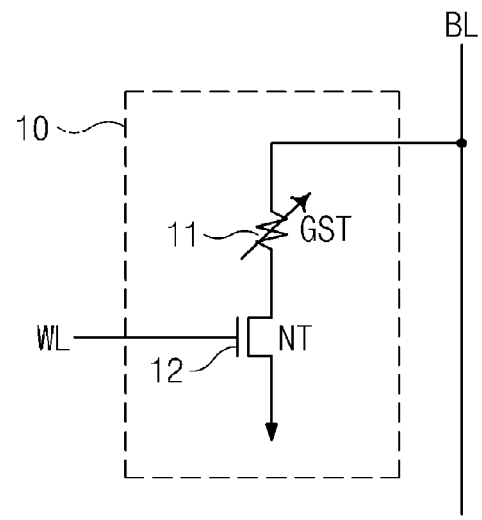
FIG. 1 and FIG. 2 illustrate a memory cell of a variable resistance memory device.
Figure 2:
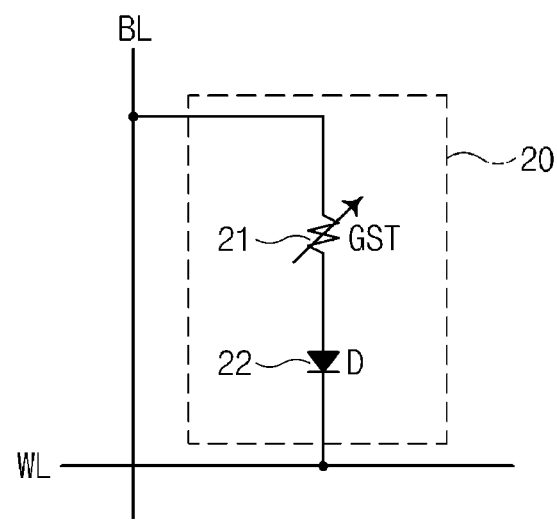
Figure 3:
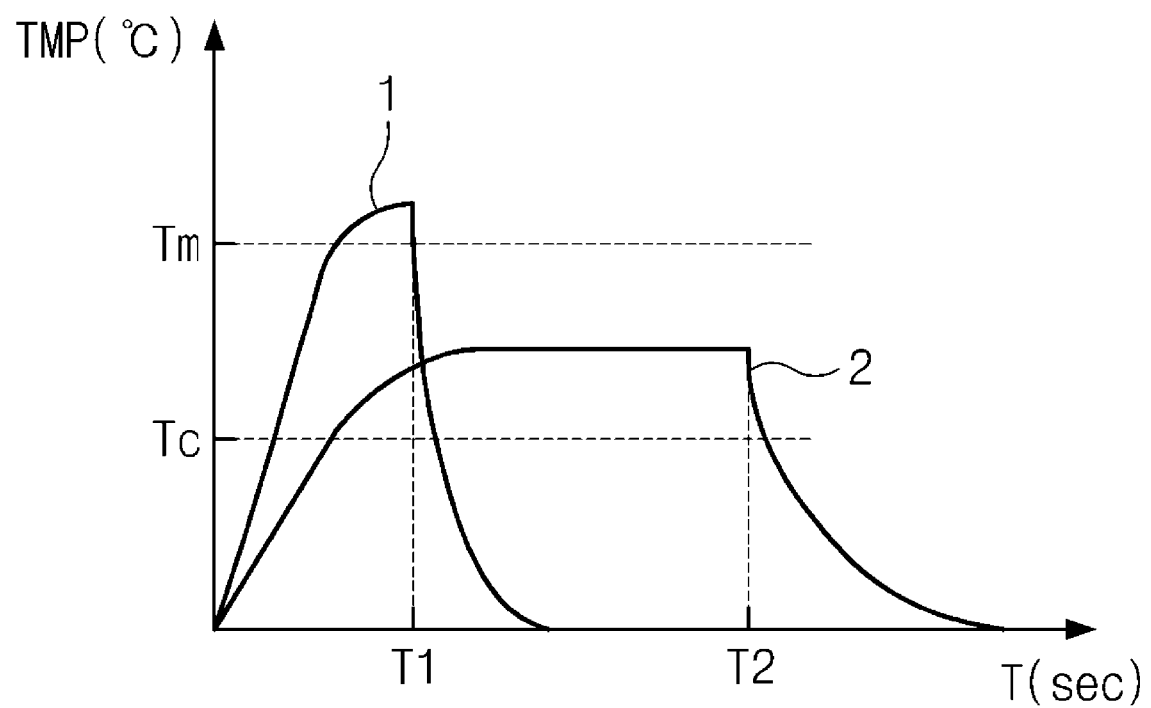
FIG. 3 is a graph for illustrating characteristics of the variable resistance material of FIG. 1 and FIG. 2.
Figure 4:
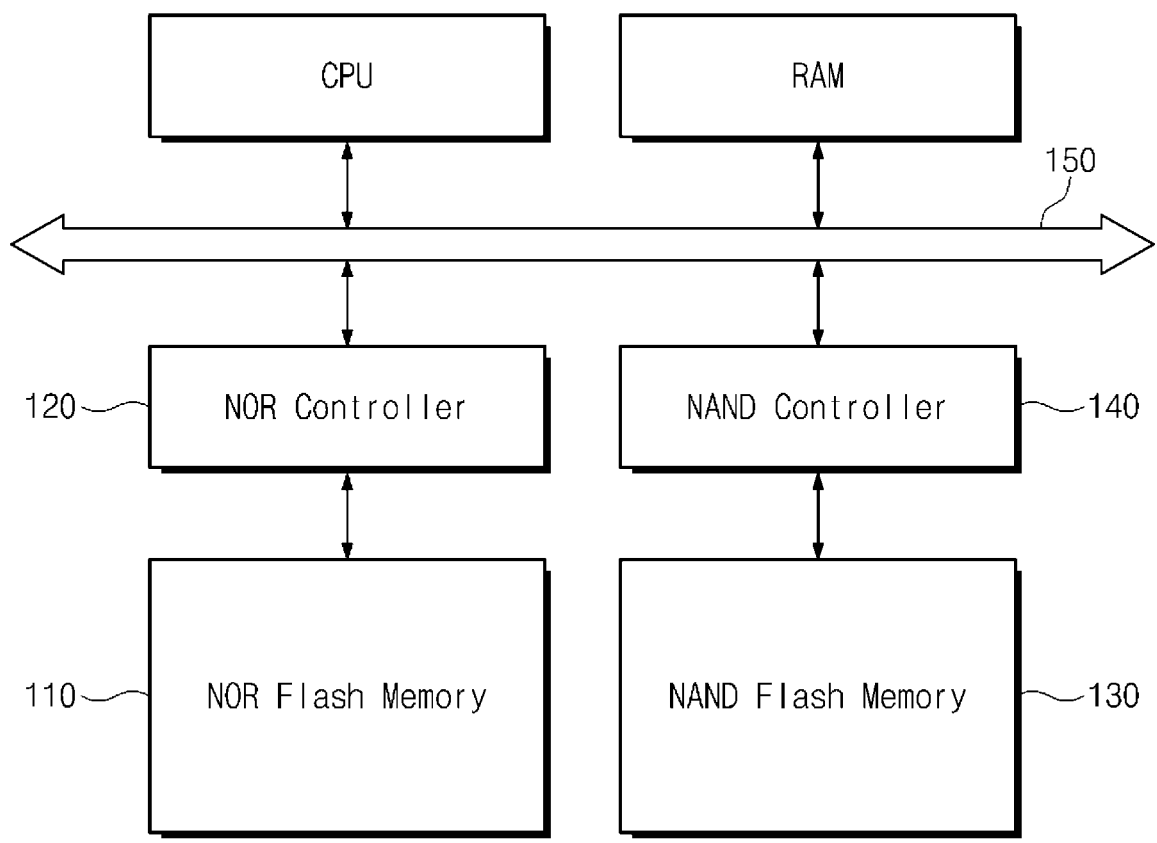
FIG. 4 is a block diagram of a general computer system including a NOR flash memory and a NAND flash memory.

The memory cell array 310 consists of a plurality of memory cells. For example, each of the memory cells may comprise a conventional memory element and a select element, such as the ones illustrated in FIGS. 1 and 2. In one embodiment of the invention, the memory element includes a variable resistance material, such as GST, and the select element includes a transistor NT or a diode D. A resistance value of the memory cell is varied according to the program state of the variable resistance material. Possible program states may include a crystalline state having a low resistance and an amorphous state having a high resistance. The crystalline state is assigned a data value of "0" which is called the set state. The amorphous state is assigned a data value of "1" which is called the reset state. On the other hand, the memory cell may be configured to have a plurality of intermediate states which are states between the crystalline state and the amorphous state. Such a multi-level cell MLC may store more than 2-bit data in one memory cell.

The address decoder 320 is connected to the memory cell array 310 by means of word lines WL. The address decoder 320 decodes an external address ADDR, and supplies a bias voltage to a selected word line WL. Also, the address decoder 320 generates a column select signal Yi for selecting bit lines BL. The column select signal Yi is provided to the column selection circuit 340. The address buffer 330 provides the address ADDR received from an external source to the address decoder 320.

The column selection circuit 340 is connected to the memory cell array 310 by means of the bit lines BL. The column selection circuit 340 selects bit lines BL in response to the column selection signal Yi provided from the address decoder 320. The column selection circuit 340 connects the selected bit lines BL and corresponding data lines DL in response to the column selection signal Yi during a write operation, and connects the selected bit line BL and corresponding sense lines SL in response to the column selection signal Yi during a read operation.

The write driver 350 receives pulse control signals, and provides a program current to the data lines DL. The pulse control signals are supplied from the control logic 370. The program current includes a set current for programming a memory cell into data "0", and a reset current for programming a memory cell into data "1". Also, the write driver 350 supplies the program current once or more according to a multi-state of the memory cell, during a multi-level cell (MLC) program operation.

The sense amplifier 355 senses a difference between a voltage of a sense line SL and a reference voltage, to read data stored in the selected memory cell. Here, the reference voltage is supplied from a reference voltage generating circuit (not shown). The sense amplifier 355 operates in response to a control signal supplied from the control logic 370.

The data input/output buffer 360 outputs or receives data to and from the memory interface 380, in response to a data input/output control signal. The data input/output control signal is supplied from the control logic 370.

The memory controller 390 controls the memory interface 380 in response to an external command. The memory interface 380 controls the control logic 370 in response to the signals supplied from the memory controller 390. The control logic 370 controls write, read, and erase operations of the variable resistance memory device.

For example, in case a read command is input by means of the system bus, the memory controller 390 detects a storage location of data, with reference to area information. The area information is stored in the memory controller 390. The area information indicates whether the memory cell array is designated to the NOR area 311 or the NAND area 312. The area information may be varied by means of mode register setting or fuse setting. For example, the mode register setting (MRS) value may be varied so that all of the memory cell array 310 may be used as the NOR area 311. The area information may be generated whenever the memory system 300 is booted. Alternatively, the area information may be stored in a non-volatile memory in the memory system 300 and loaded on booting.

In case (e.g.) code data or meta data is stored in the NOR area 311, the memory controller 390 controls the memory interface 380 so that the NOR area 311 of the variable resistance memory device may be accessed. Here, the memory interface 380 supplies NOR area access signals to the control logic 370. Or, in case (e.g.) user data is stored in the NAND area 312, the memory controller 390 controls the memory interface 380 so as to access the NAND area 312 of the variable resistance memory device. Here, the memory interface 380 supplies NAND area access signals to the control logic 370. The control logic 370 accesses the NOR area 311 or the NAND area 312 in response to the NOR area access signals or the NAND area access signal supplied from the memory interface 380.

According to the above described configuration, the memory system 300 illustrated in FIG. 6 may selectively access the NOR area 311 or the NAND area 312. One possible method for accessing the NOR area 311 and the NAND area 312 within memory system 300 will be described below in some additional detail.

Figure 7:
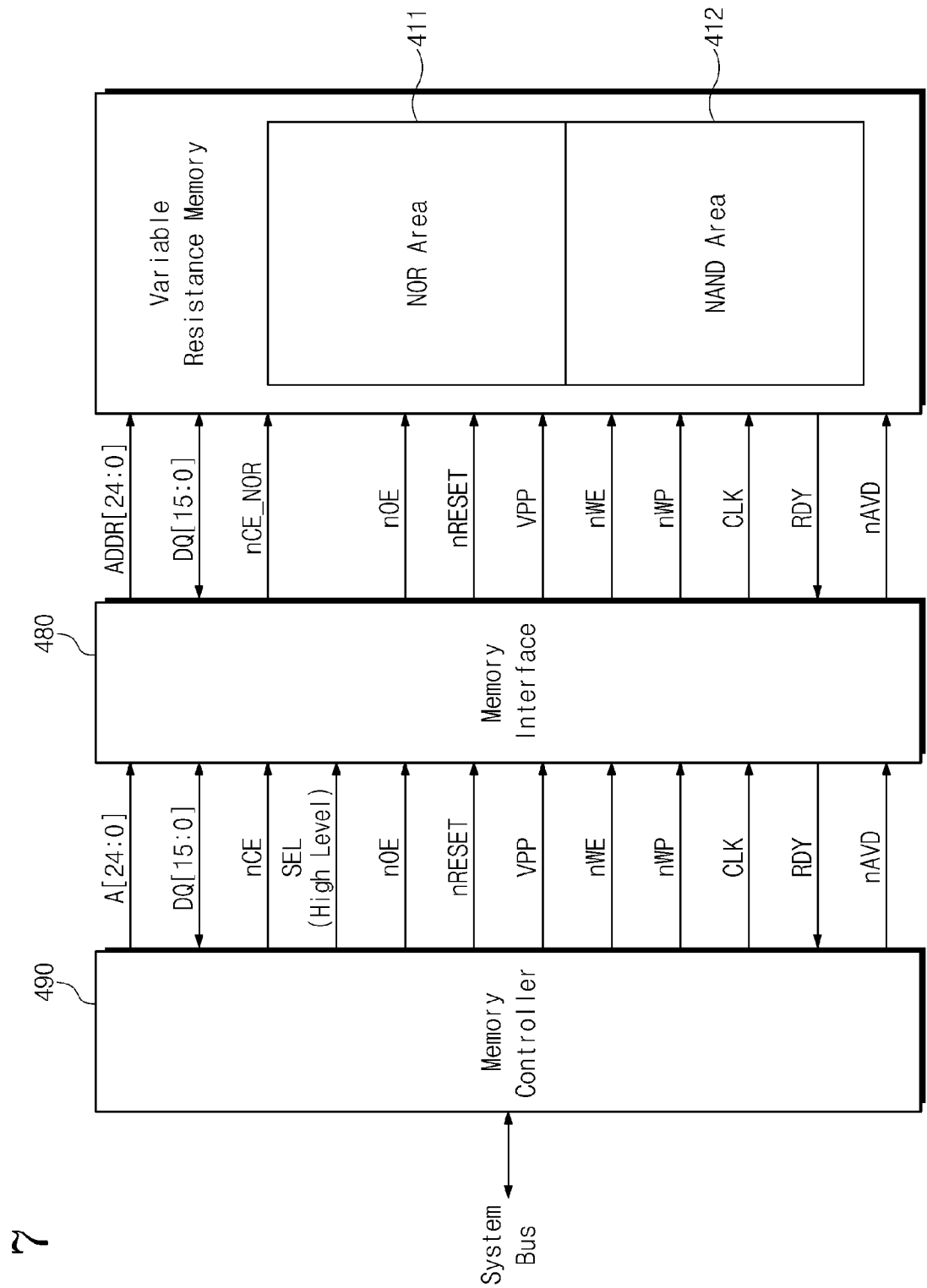
FIG. 7 is a block diagram illustrating exemplary control/address/data signals for the memory system of FIG. 6.

FIG. 7 is a block diagram illustrating various control/address/data signals for the exemplary memory system illustrated in FIG. 6. Such signaling is useful when the NOR area of the variable resistance memory device is accessed. Referring to FIG. 7, the memory controller 490 supplies a plurality of signals to the memory interface 480 in response to an external command input via a system bus. In detail, the memory controller 490 supplies a plurality of signals to the memory interface 480 by means of address pins A[24:0], data pins DQ[15:0], a chip enable signal pin nCE, a select signal pin SEL, an output enable signal pin nOE, a reset signal pin nRESET, a write enable signal pin nWE, a write protection pin nWP, a clock signal pin CLK, and an address valid input signal pin nAVD. Particularly, the memory controller 490 supplies a select signal SEL of a high level to the memory interface 480 in order to access a NOR area 411 of a variable resistance memory device.

The memory interface 480 supplies a plurality of signals to the variable resistance memory device in response to the select signal SEL of a high level. The plurality of signals are signals for accessing the NOR area 411. Particularly, the memory interface 480 supplies an activated NOR chip enable signal nCE_NOR to the variable resistance memory device.

In other words, the memory controller 490 supplies a plurality of signals to the memory interface 480 in response to an external command. The memory interface 480 converts the plurality of signals into NOR area access signals in response to the select signal SEL of a high level, and supplies the converted NOR area access signals to the variable resistance memory device.

Figure 8:
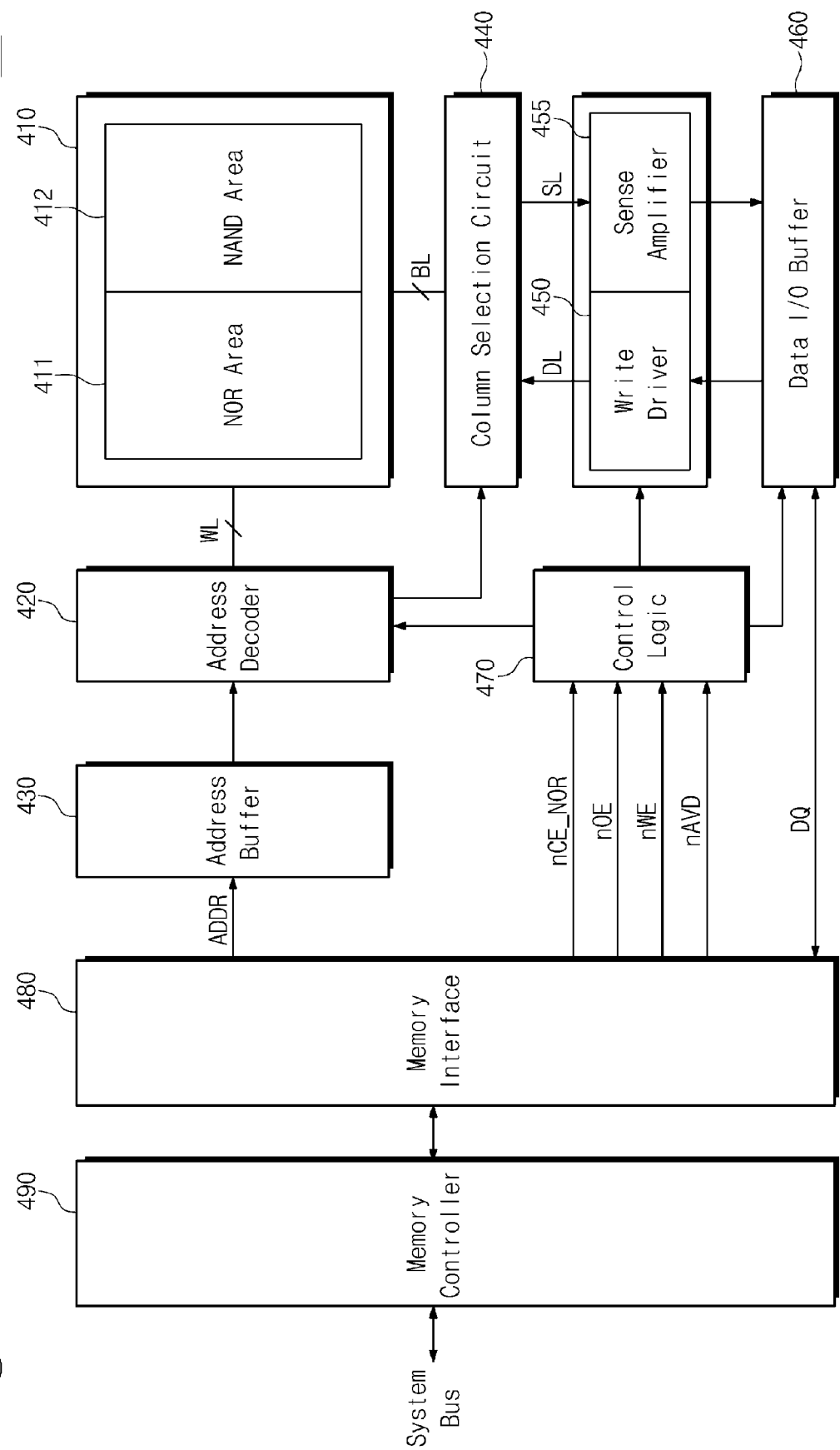
FIG. 8 is a block diagram illustrating one possible method operable within the memory system of FIG. 6.

FIG. 8 is a block diagram illustrating one possible method operable within the memory system of FIG. 6 for accessing the NOR area of a variable resistance memory device. Referring to FIG. 8, a memory controller 490 supplies a plurality of signals to a memory interface 480 in response to an external command. Particularly, the memory controller 490 supplies a select signal SEL of a high level to the memory interface 480 in order to access a NOR area 411 of the variable resistance memory device.

The memory interface 480 supplies a plurality of signals to the variable resistance memory device in response to the select signal SEL of a high level. In detail, the memory interface 480 supplies an address ADDR to the address buffer 430. And, the memory interface 480 supplies a NOR chip enable signal nCE_NOR, an output enable signal nOE, a write enable signal nWE, and an address valid input signal nAVD to the control logic 470. In particular, the memory interface 480 supplies an activated NOR chip enable signal nCE_NOR to the control logic 470.

The control logic 470 controls peripheral circuits (including an address decoder 420, a write driver 450, a sense amplifier 455, and a data input/output buffer 460) so as to access the NOR area 411 of the memory cell array in response to the activated NOR chip enable signal nCE_NOR.

Figure 9:
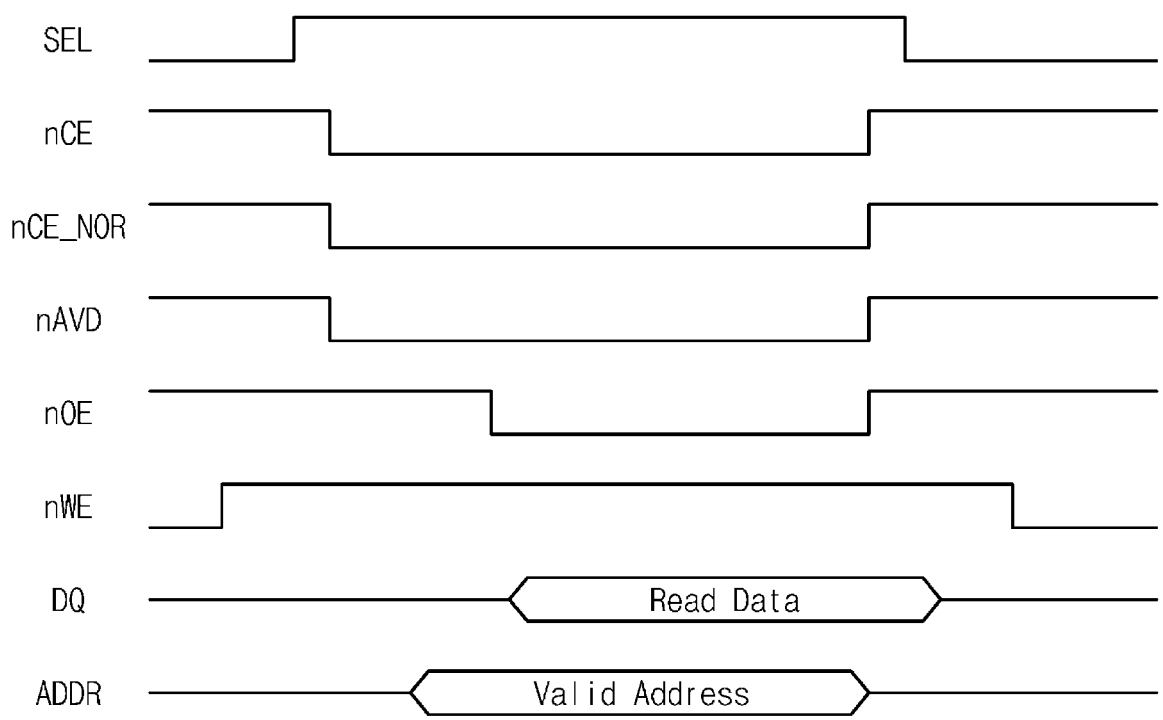
FIG. 9 is a timing diagram further illustrating exemplary NOR area access operation for the memory system of FIG. 8.

FIG. 9 is a related timing diagram further illustrating an exemplary NOR area access operation within the memory system of FIG. 8. Referring to FIG. 9, a read operation for a NOR area 411 (refer to FIG. 8) is illustrated as an exemplary embodiment. Initially, the NOR chip enable signal nCE_NOR becomes a low level by a high-level select signal SEL and a low-level chip enable signal nCE. The control logic 470 controls an address decoder 420, a sense amplifier 455, and a data input/output buffer 460 in response to the NOR chip enable signal nCE_NOR of a low level. When an address valid input signal nAVD is at a low level, a valid address is inputted. The address decoder 420 indicates a memory cell corresponding to the inputted valid address. The sense amplifier 455 senses and amplifies data stored in the memory cell. Read data is transferred to the memory interface 480 via the data input/output buffer 460.

Figure 10:
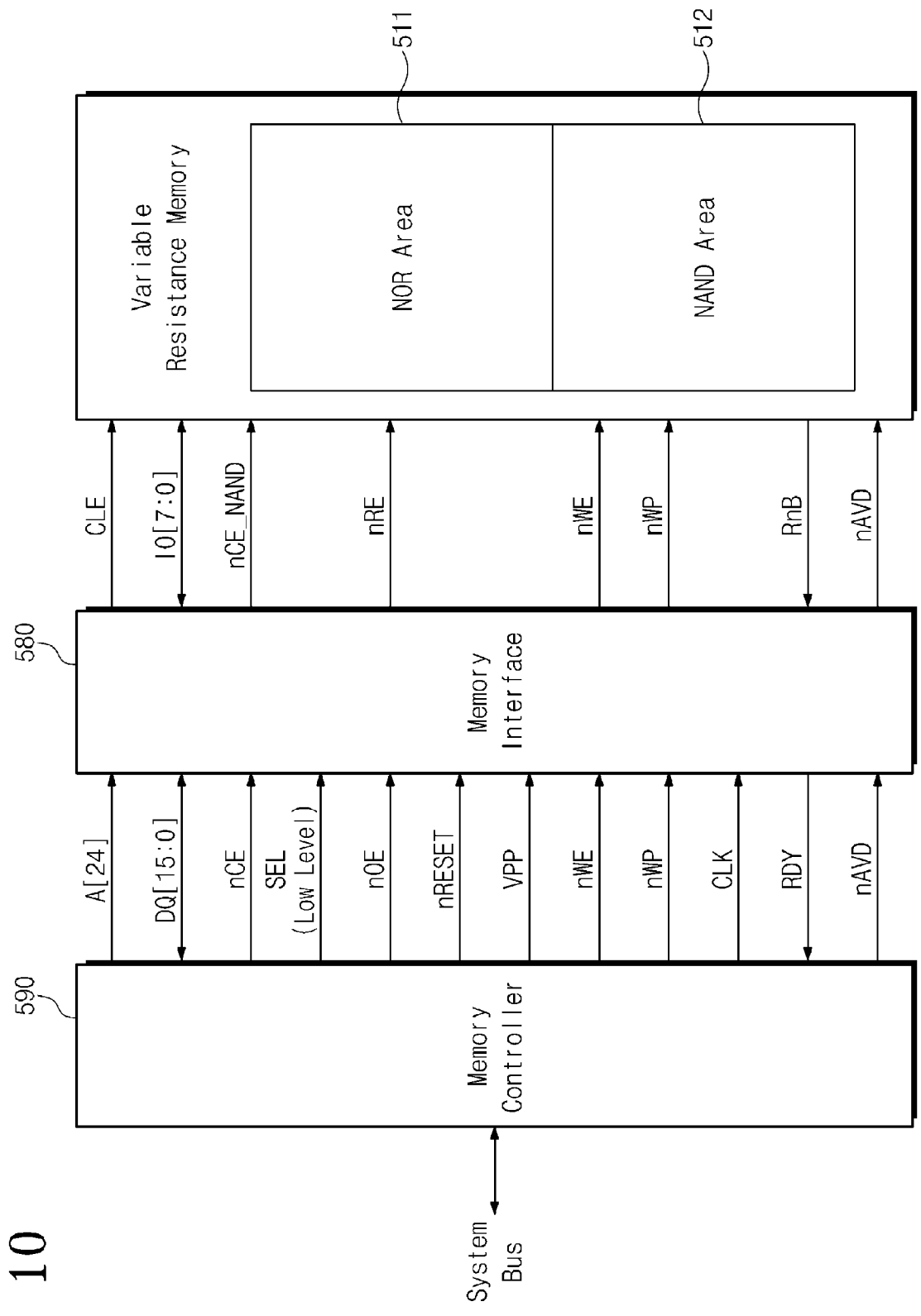
FIG. 10 is a block diagram illustrating control/address/data signals for the memory system of FIG. 6.

FIG. 10 is a block diagram illustrating control/address/data signals within the memory system of FIG. 6 while accessing a NAND area 512 of a variable resistance memory device.

Referring to FIG. 10, a memory controller 590 supplies a plurality of signals to a memory interface 580 in response to an external command. In detail, the memory controller 590 supplies a plurality of signals to the memory interface 580 via address pins A[24:0], data pins DQ[15:0], a chip enable signal pin nCE, a select signal pin SEL, an output enable signal pin nOE, a reset signal pin nRESET, a write enable signal pin nWE, a write protection signal pin nWP, a clock signal pin CLK, and an address valid input signal pin nAVD. Particularly, the memory controller 590 supplies a select signal SEL of a low level to the memory interface 580 in order to access a NAND area 512 of a variable resistance memory device.

The memory interface 580 converts a plurality of signals into NAND area access signals in response to a select signal SEL of a low level. For example, the memory interface 580 converts a signal inputted via an uppermost pin A[24] of the address pins A[24:0] into a command latch enable signal CLE to supply it to the variable resistance memory device. Also, the memory interface 580 supplies an activated NAND chip enable signal nCE_NAND to the variable resistance memory device.

In other words, the memory controller 590 supplies a plurality of signals to the memory interface 580 in response to an external command. However, the plurality of signals does not conform to the NAND flash memory specification. Therefore, the memory interface 580 converts the plurality of signals into NAND area access signals in response to the select signal SEL of a low level, and supplies the converted NAND area access signals to the variable resistance memory device.

Figure 11:
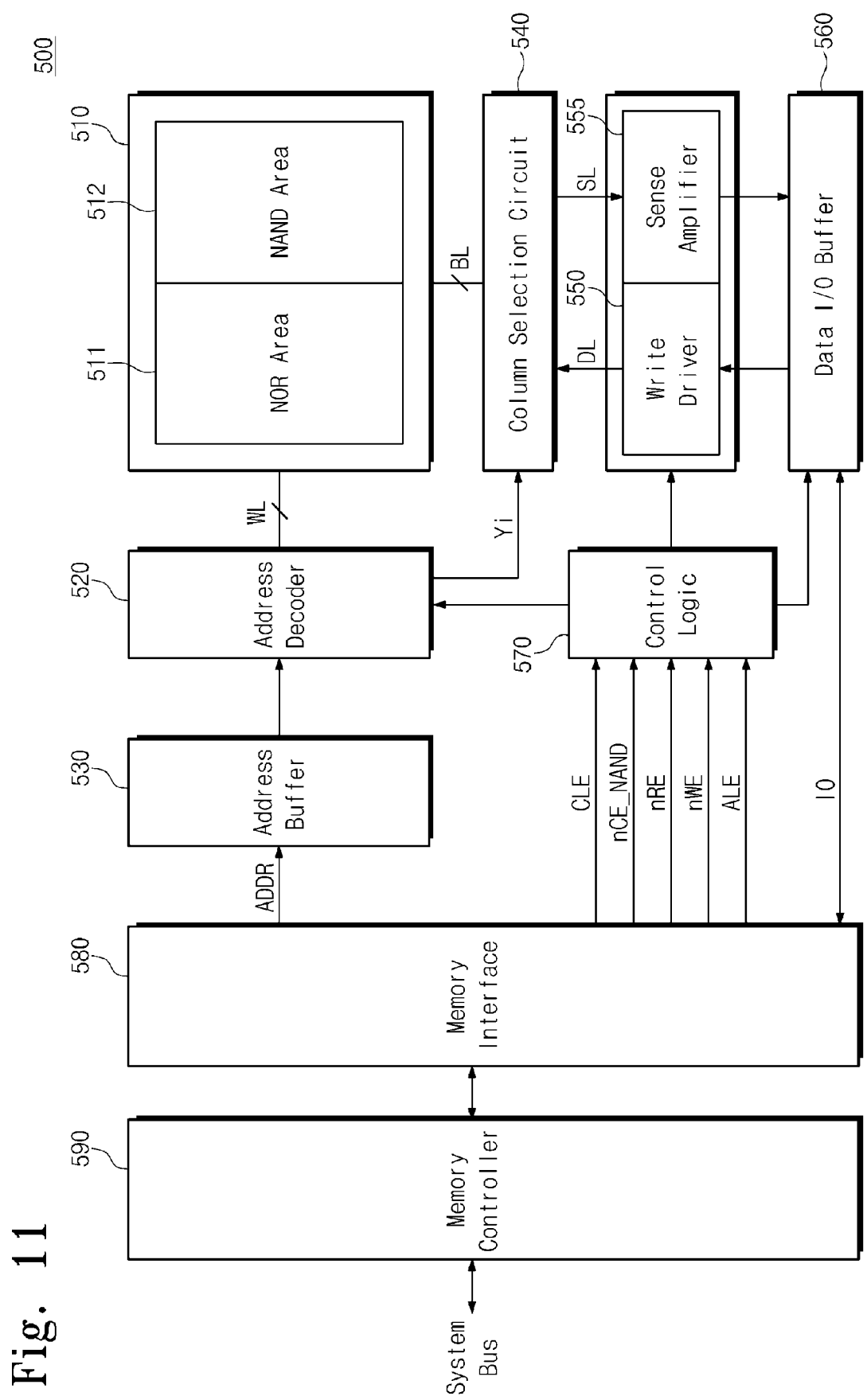
FIG. 11 is a block diagram further illustrating one possible method operable within the memory system of FIG. 6.

FIG. 11 is a block diagram illustrating one possible method operable within the memory system of FIG. 6 for accessing the NAND area of a variable resistance memory device. Referring to FIG. 11, a memory controller 590 supplies a plurality of signals to the memory interface 580 in response to an external command. In particular, the memory controller 590 supplies a select signal SEL of a low level to the memory interface 580 in order to access the NAND area 512 of the variable resistance memory device.

The memory interface 580 supplies a plurality of signals to the variable resistance memory device in response to the select signal SEL of a low level. In detail, the memory interface 580 supplies an address ADDR to the address buffer 530. And the memory interface 580 supplies a command latch enable signal, a NAND chip enable signal nCE_NAND, a read enable signal nRE, a write enable signal nWE, and an address latch enable signal ALE to the control logic 570. In particular, the memory interface 570 supplies an activated NAND chip enable signal nCE_NAND to the control logic 570.

The control logic 570 controls peripheral circuits (including an address decoder 520, a write driver 550, a sense amplifier 555, and a data input/output buffer 560) so as to access the NAND area 512 of the memory cell array, in response to the activated NAND chip enable signal nCE_NAND. Particularly, the control logic 570 outputs data to the memory interface 380 in case page data is inputted to the data input/output buffer 360. The data input/output control signal is supplied from the control logic 370. In other words, the NAND area 512 is accessed in a page unit, contrary to the NOR area 511.

Figure 12:
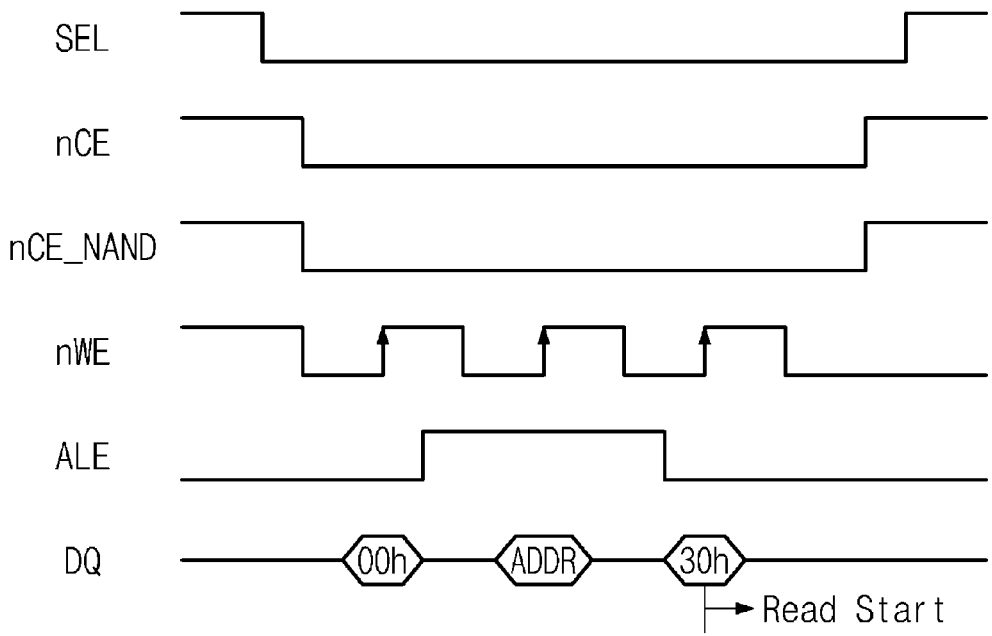
FIG. 12 is a timing diagram further illustrating exemplary NAND area access operation for the memory system of FIG. 11.

FIG. 12 is a related timing diagram further illustrating an exemplary NAND area access operation within the memory system of FIG. 11. Referring to FIG. 12, a read operation for the NAND area 512 (refer to FIG. 11) is illustrated as an exemplary embodiment. Initially, a NAND chip enable signal nCE_NAND becomes a low level by a select signal SEL of a low level and a chip enable signal nCE of a low level. Control logic 570 controls an address decoder 520, a sense amplifier 555, and a data input/output buffer 560 in response to the NAND chip enable signal nCE_NAND of a low level.

Whenever a write enable signal nWE transitions from a low level to a high level, commands and address are inputted. Initially, a command 00h is inputted. When an address latch enable signal ALE is at a high state, an address ADDR is inputted. The address ADDR includes a row address and a column address. The address decoder 520 indicates a memory cell corresponding to the inputted address ADDR. And, a read operation is performed in response to a command 30h. The sense amplifier 555 senses and amplifies data stored in the memory cell. The amplified data is transferred to the memory interface 580 via the data input/output buffer 560.

Figure 13:
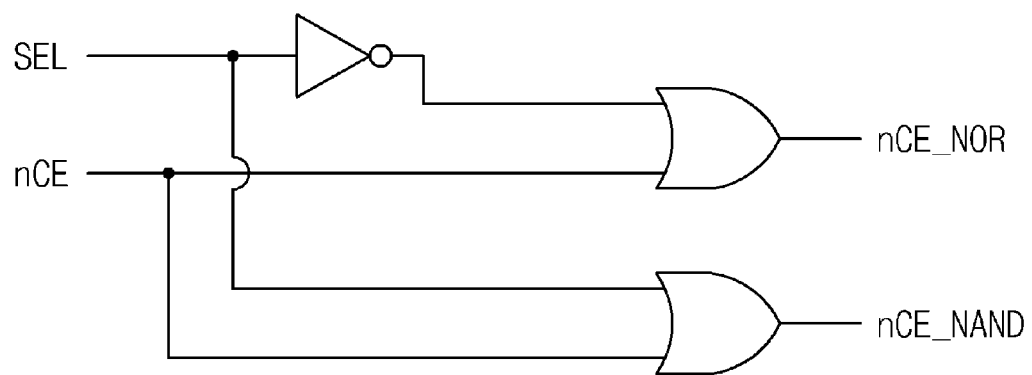
FIG. 13 is a circuit diagram further illustrating on approach within the memory interface of FIG. 6 for activating a NOR chip enable signal or a NAND chip enable signal.

FIG. 13 is a circuit diagram illustrating one possible approach to the operation of the memory interface of FIG. 6 in activating a NOR chip enable signal or a NAND chip enable signal. A memory interface 380 (refer to FIG. 6) according to an embodiment of the invention may includes the circuit illustrated in FIG. 13. Referring to FIG. 13, the memory interface 380 selectively activates the NOR chip enable signal nCE_NOR or a NAND chip enable signal nCE_NAND in response to a select signal SEL or a chip enable signal nCE. For example, when a select signal SEL of a high level and a chip enable signal nCE of a low level are inputted, the NOR chip enable signal nCE_NOR is activated. On the other hand, when a select signal SEL of a low level and a chip enable signal nCE of a low level are inputted, the NAND chip enable signal nCE_NAND is activated.

The activated NOR chip enable signal nCE_NOR or the activated NAND chip enable signal nCE_NAND is supplied to the control logic 370 to access a NOR area 311 or a NAND area 312 of the variable resistance memory device. For example, when the activated NOR chip enable signal nCE_NOR is supplied to the control logic 370, the NAND area 312 of the variable resistance memory device is accessed.

Figure 14:
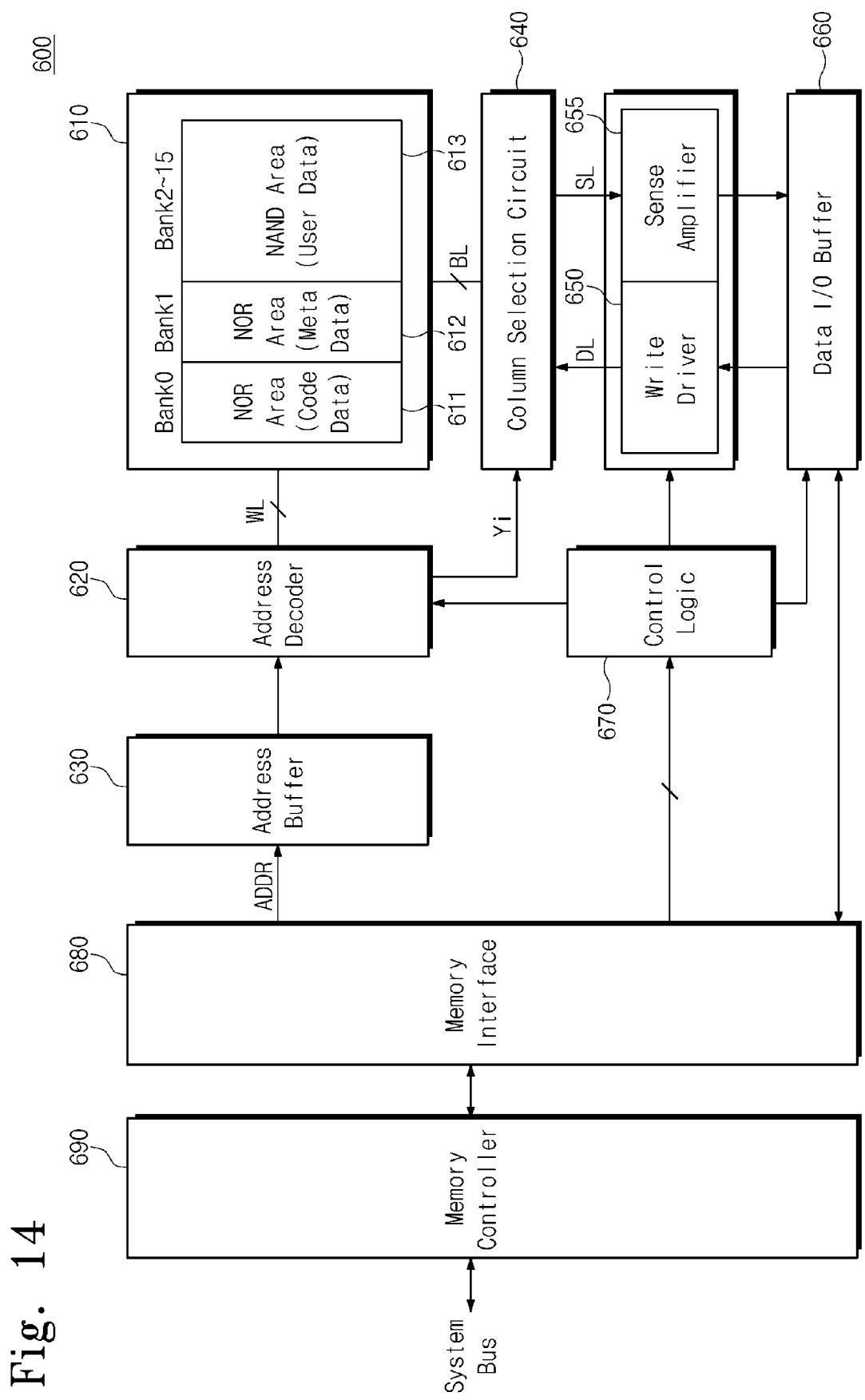
FIG. 14 is a block diagram illustrating another embodiment of a memory system according to an embodiment of the invention.

FIG. 14 is a block diagram illustrating another embodiment of a memory system according to the present invention. Referring to FIG. 14, a memory system 600 includes a variable resistance memory device, a memory interface 680 and a memory controller 690. The variable resistance memory device includes a memory cell array 610, an address decoder 620, an address buffer 630, a column selection circuit 640, a write driver 650, a sense amplifier 655, a data input/output buffer 660, and control logic 670.

The memory cell array 610 may be divided into a NOR area 611 for storing code data, a NOR area 612 for storing meta data, and a NAND area 613 for storing user data. In this exemplary embodiment, code data and meta data are stored in separate banks. Therefore, it is possible to perform a read while write operation. For example, it is possible to perform a read operation for code data during a write operation for meta data. Therefore, operating speed of the memory system is increased.

Figure 15:
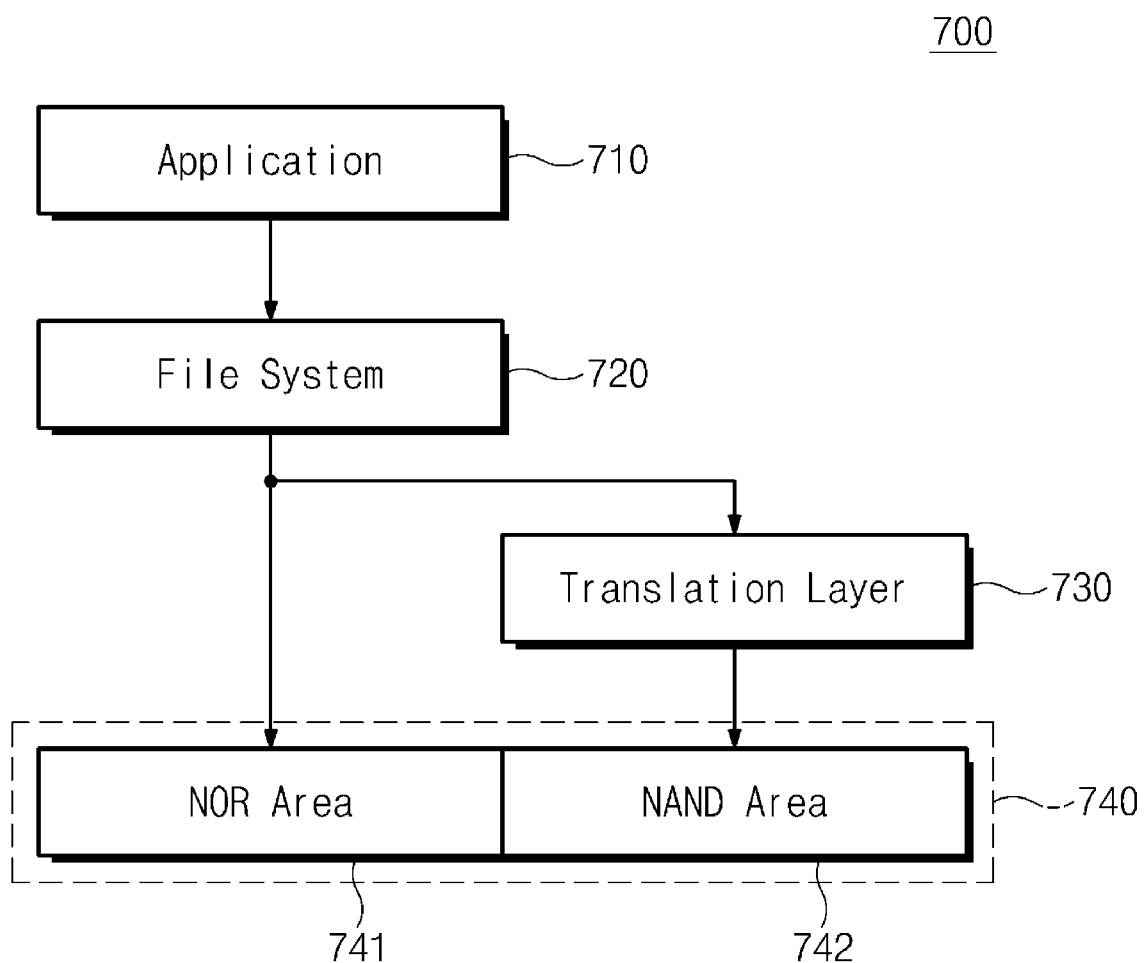
FIG. 15 is a diagram illustrating one possible software structure for the memory system according to an embodiment of the invention.

FIG. 15 is a diagram illustrating one possible software structure for a memory system including the variable resistance memory device according to embodiments of the present invention. Referring to FIG. 15, a memory system software structure 700 includes an application layer 710, a file system layer 720 callable by the application layer 710, a translation layer 730 callable by the file system layer 720, and a control layer associated with variable resistance memory device 740. The variable resistance memory device control layer 740 includes portions associated with the control of a NOR area 741 and a NAND area 742.

Initially, a method of accessing the NOR area 741 of the variable resistance memory device 740 is described. The file system layer 720 first receives a read, write, and erase request from the application layer 710 and transfers the addresses of sectors to be read, written, and erased to the variable resistance memory device 740. As the NOR area 741 may be accessed randomly, it may be accessed without passing through the translation layer 730.

A method of accessing the NAND area 742 of the variable resistance memory device 740 is described. The file system layer 720 first receives read, write, and erase requests from the application layer 710 and transfers addresses of sectors to be read, written, and erased to the translation layer 730. The translation layer 730 converts the addresses of the sectors into physical addresses and transfers it to the variable resistance memory device 470. As a result, the NOR area 741 of the variable resistance memory device may be accessed without using the translation layer 730, but the NAND area 742 is accessed via the translation layer 730.

The software controlling both the NOR area and NAND area of the memory system according to an embodiment of the present invention may be executed by a common memory controller. Therefore, the fabrication cost of the memory system may be decreased and the integration density increased. Besides, as embodiments of the present invention may be substituted with a NOR flash memory or a NAND flash memory, it may be applied to devices using flash memories, for example, memory cards and solid state drives (SSD).

Although the present invention has been described in connection with certain embodiments of the present invention illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory device comprising:
   a memory cell array including a plurality of variable resistance memory cells divided into a first area and a second area;
   an input/output circuit configured to access the memory cell array; and
   control logic configured to control the input/output circuit to access the first area or the second area in response to an external command,
   wherein the input/output circuit accesses the first area in a memory cell unit, and accesses the second area in a page unit.

2. The semiconductor memory device of claim 1 further comprises:
   a memory interface configured to control the control logic in response to external control signals and a select signal, wherein the control signals include a command, an address, and data, and the select signal selects between the first area and the second area.

3. The semiconductor memory device of claim 2, wherein the memory interface converts the control signals into first area access signals or second area access signals in response to the select signal.

4. The semiconductor memory device of claim 2, wherein the memory interface controls the control logic so that code data or meta data is stored in the first area.

5. The semiconductor memory device of claim 4, wherein the first area includes a plurality of banks, and the code data and meta data are stored in separate banks.

6. The semiconductor memory device of claim 5, wherein the memory interface enables one of the code data and the meta data to be written while the other is being read.

7. The semiconductor memory device of claim 4, wherein the memory interface controls the control logic such that user data is stored in the second area.

8. The semiconductor memory device of claim 1, wherein the variable resistance memory cells include a plurality of phase change memory cells.

9. A memory system comprising:
a semiconductor memory device including a variable resistance memory cell array divided into a first area and a second area; and
a memory controller configured to access the first area or the second area in response to an external command,
wherein the semiconductor memory device accesses the first area in a memory cell unit, and accesses the second area in a page unit.

10. The memory system of claim 9 further comprises:
a memory interface configured to access the first area or the second area of the variable resistance memory cell array in response to the control signals and a select signal from the memory controller,
wherein the control signals include a command, an address, and data, and the select signal selects one of the first area and the second area.

11. The memory system of claim 10, wherein the memory interface converts the control signals into first area access signals or second area access signals in response to the select signal.

12. The memory system of claim 10, wherein the memory controller controls the memory interface so that code data or meta data is stored in the first area of the semiconductor memory device.

13. The memory system of claim 12, wherein the first area of the semiconductor memory device includes a plurality of banks, and the code data and meta data are stored in separate banks.

14. The memory system of claim 12, wherein the memory controller enables execution of a write operation directed to one of the code data and the meta data during execution of a read operation directed to the other.

15. The memory system of claim 10, wherein the memory controller controls the memory interface such that user data is stored in the second area.

16. The memory system of claim 9, wherein the variable resistance memory cell array includes a plurality of phase change memory cells.

17. The memory system of claim 9, wherein the memory controller stores area information of the first area and the second area, and detects a storage location of data with reference to the area information.

18. The memory system of claim 17, wherein the area information is varied by a mode register setting (MRS) or a fuse setting.

19. The memory system of claim 9, wherein the semiconductor memory device and the memory controller are realized in a single semiconductor integrated circuit.

20. A memory system comprising:
a semiconductor memory device; and
a memory controller configured to supply control signals and a select signal to the semiconductor memory device in response to an external command,
wherein the semiconductor memory device includes:
a variable resistance memory cell array divided into a first area and a second area;
an input/output circuit configured to access the variable resistance memory cell array;
a memory interface configured to convert the control signals into first area access signals or second area access signals in response to the select signal; and
a control logic for controlling the input/output circuit in response to the first area access signals or the second area access signals.

21. The memory system of claim 20, wherein the control logic accesses the first area in a memory cell unit and accesses the second area in a page unit.

22. The memory system of claim 20, wherein the input/output circuit comprises:
a row decoder configured to receive an address from the memory interface, and select a word line corresponding to the address;
a column decoder configured to receive an address form the memory interface, and select a bit line corresponding to the address;
a write driver configured to receive a pulse control signal from the control logic and supply a program current to a data line;
a sense amplifier configured to sense a difference between a voltage of a sense line and a reference voltage and read data stored in the memory cell; and
a data input/output buffer configured to receive data from the memory interface or output data to the memory interface, in response to a data input/output signal from the control logic.

23. The memory system of claim 20, wherein the memory controller controls the memory interface such that code data or meta data is stored in the first area of the variable resistance memory cell array.

24. The memory system of claim 23, wherein the first area of the semiconductor memory device includes a plurality of banks, and the code data and meta data are stored in separate banks.

* * * * *